(12) United States Patent
Pletner et al.

(10) Patent No.: US 7,656,076 B1
(45) Date of Patent: Feb. 2, 2010

(54) UNIMORPH/BIMORPH PIEZOELECTRIC PACKAGE

(75) Inventors: Baruch Pletner, Newton, MA (US); Grace R. Kessenich, Somerville, MA (US); Wesley T. Horth, Dalton, MA (US)

(73) Assignee: IPTrade, Inc., Newton, MA (US)

( * ) Notice: Subject to any disclaimer, the term of this patent is extended or adjusted under 35 U.S.C. 154(b) by 0 days.

(21) Appl. No.: 12/173,696

(22) Filed: Jul. 15, 2008

(51) Int. Cl.
*H01L 41/08* (2006.01)

(52) U.S. Cl. .................. 310/340; 310/332; 310/348

(58) Field of Classification Search ............... 310/328, 310/330–332, 340, 344, 348
See application file for complete search history.

(56) References Cited

U.S. PATENT DOCUMENTS

| | | | |
|---|---|---|---|
| 4,499,394 A | | 2/1985 | Koal |
| 4,656,384 A | * | 4/1987 | Magori ................ 310/334 |
| 4,939,405 A | * | 7/1990 | Okuyama et al. ........... 310/330 |
| 5,339,291 A | | 8/1994 | Libuha et al. |
| 5,381,385 A | | 1/1995 | Greenstein |
| 6,781,285 B1 | * | 8/2004 | Lazarus et al. ............ 310/332 |
| 6,969,945 B2 | * | 11/2005 | Namba et al. ............ 310/340 |
| 2002/0047496 A1 | | 4/2002 | Wierach |
| 2006/0186757 A1 | | 8/2006 | Pletner et al. |
| 2008/0203851 A1 | * | 8/2008 | Pletner et al. ............ 310/317 |
| 2008/0218026 A1 | * | 9/2008 | Pletner et al. ............ 310/314 |

FOREIGN PATENT DOCUMENTS

| EP | 0 926 387 A2 | 6/1999 |
|---|---|---|
| EP | 1 199 758 A2 | 4/2002 |
| EP | 1 422 440 A1 | 5/2004 |

OTHER PUBLICATIONS

Office Action dated Mar. 30, 2009 for U.S. Appl. No. 12/173/716, filed Jul. 15, 2008, inventor: Baruch Pletner, (6 pages).
PCT Invitation to Pay Additional Fees for Additional Search for PCT/US2008/070095, Applicant: IPTRADE, Inc., Form PCT/ISA/206, dated May 8, 2009 (5 pages).

* cited by examiner

*Primary Examiner*—Mark Budd
(74) *Attorney, Agent, or Firm*—Vista IP Law Group LLP

(57) ABSTRACT

A piezoelectric package comprises an upper and lower piezoelectric plates, each having opposing electrodes. The piezoelectric package further comprises an electrically insulative structure encapsulating the piezoelectric plates. The piezoelectric package further comprises first and second external connectors mounted to the insulative structure. The connectors respectively have connector terminals that are electrically coupled to the electrodes in different orders, and have geometric arrangements that are identical, such that a single interface device can be selectively mated to either of the connectors. The piezoelectric package may be incorporated into a system that comprises electronic circuitry configured for operating the piezoelectric package, and a single interface device electrically coupled between the electronic circuitry and either of the external connectors of the piezoelectric package to selectively configure the package between a unimorph and a bimorph.

25 Claims, 7 Drawing Sheets

UNIMORPH/BIMORPH PIEZOELECTRIC PACKAGE

RELATED APPLICATIONS

This application is filed concurrently with U.S. patent application Ser. No. 12/173,716, entitled "Scalable Piezoelectric Package," the disclosure of which is expressly incorporated herein by reference.

FIELD OF THE INVENTION

The present inventions generally relate to devices for sensing and suppressing vibrations, and in particular, to piezoelectric sensors and actuators for use on equipment.

BACKGROUND OF THE INVENTION

Structural vibration is one of the key performance limiting phenomena in many types of advanced machinery, such as space launch vehicle shrouds, all types of jet and turbine engines, robots, and many types of manufacturing equipment. Because structural vibration depends on many factors that are not easily modeled, such as boundary and continuity conditions, as well as the disturbance environment, it is impossible to design a machine from the first prototype that will meet all vibration requirements. This means that the final steps in analyzing and suppressing vibration are accomplished after the actual production unit has been completed.

To address this shortfall, it is known to incorporate vibration analysis and suppression systems into equipment. In general, a typical vibration analysis and suppression system includes a multitude of vibration sensors and vibration actuators that are installed on-board the equipment in selected locations. The system also includes a control system that transmits control signals in accordance with a vibration suppression algorithm to the actuators during normal operation of the equipment to mechanically suppress the vibrations. Using a feedback loop, the sensed vibration information is fed back to the control circuitry, which adjusts the control signals in response to dynamic conditions.

It is also known to incorporate vibration analysis devices into equipment for the purpose of performing non-destructive testing (i.e., testing that does not destroy the equipment). For example, sensors can be incorporated into aircraft to measure flow and combustion induced vibrations in turbines or combustion housings of propulsion systems, can be incorporated pre-forms, concrete and other structures that require cure-monitoring, or can be incorporated into equipment to monitor damage (e.g., delamination) that may present as a change in vibration characteristics.

Significant to the present invention, piezoelectric sensors and actuators are utilized extensively to detect and/or suppress vibrations in equipment. Such piezoelectric devices can be incorporated into the host structure of the equipment as plates that can be embedded within the host structure or externally applied to the host structure as patches. When used as a sensor, a piezoelectric plate contracts and expands along a plane parallel to the surface of the plate (in the x- and y-direction) in response to vibrations induced within the piezoelectric plate via the host structure, which in turn, induces an electrical field in a plane perpendicular to the surface of the plate (in the z-direction), creating a voltage potential between the top and bottom surfaces of the piezoelectric plate. In a similar manner, when used as an actuator, a piezoelectric plate contracts and expands along a plane parallel to the surface of the plate (in the x- and y-direction) in response to a voltage potential between the top and bottom surfaces of the piezoelectric plate that induces an electrical field induced in a plane perpendicular to the surface of the plate (in the z-direction), which in turn, induces a vibration in the host structure. Whether used as a sensor or an actuator, the magnitude of the voltage potential on the top and bottom surfaces of the piezoelectric plate will be proportional to the magnitude of the contraction/expansion of the piezoelectric plate, and thus, the vibrations of the host structure. Thus, the nature of the vibrations sensed within the host structure can be determined via analysis of the voltage potential, and the nature of the vibrations induced within the host structure can be controlled via the voltage potential applied to the piezoelectric plate.

To protect the very fragile piezoelectric plate from damage, and to functionally couple the piezoelectric plate between the host structure and the external circuitry that senses vibrations from the host structure and/or induces vibrations within the host structure, it is necessary to incorporate the piezoelectric plate into a package. Such packages typically include a pair of wire leads respectively coupled to the top and bottom surfaces of the piezoelectric plate to convey the voltage potential to and/or from the piezoelectric plate, and one or more layers of an electrically insulating material that encapsulate the piezoelectric plate to not only protect it from damage that might otherwise occur when dropped or mishandled, but also to electrically insulate the piezoelectric plate and wire leads from the host structure. A connector is typically mounted to the piezoelectric package, so that a cable from the control/sensing circuit can be operably coupled to the piezoelectric plate.

Piezoelectric packages are generally supplied to a user in a one size. Thus, if a single piezoelectric package is insufficient for providing the desired actuation or sensing functions at a particular location of the host structure, it may be desirable to locate multiple piezoelectric packages at this location. In this case, however, multiple cables must be connected between the control/sensing circuit and the respective connectors of the piezoelectric packages, even though the multiple packages function as a single actuator/sensor. In other words, the actuation/sensing function at a particular location of a host structure may not be easily scalable.

Oftentimes, a pair of upper and lower piezoelectric plates are incorporated into the piezoelectric package, which allows the package, when used as either an actuator or a sensor, to be operated in a specific morphological configuration, and in particular, in either a unimorph (or extensional) configuration or in a bimorph (or bending) configuration.

In a unimorph configuration, the piezoelectric plates both expand or both contract when signals of the same polarity are transmitted to the respective piezoelectric plates (assuming the package is operated as an actuator), and signals of the same polarity are received from the respective piezoelectric plates when the piezoelectric plates both expand or both contract (assuming the package is operated as a sensor). The piezoelectric package can be configured as a unimorph by coupling leads of the same polarity to the same polarized sides of the respective piezoelectric plates (e.g., positive leads to the positively polarized sides of the piezoelectric plates, and negative leads to the negatively polarized sides of the piezoelectric plates).

In contrast, in a bimorph configuration, one piezoelectric plate expands while the other piezoelectric plate contracts when signals of the same polarity are transmitted to the respective piezoelectric plates (assuming the package is operated as an actuator), and signals of the same polarity are received from the respective piezoelectric plates when one piezoelectric plate expands while the other piezoelectric plate contracts (assuming the package is operated as a sensor). The piezoelectric package can be configured as a bimorph by coupling leads of the opposite polarity to the same polarized sides of the respective piezoelectric plates (e.g., one positive lead and one negative lead respectively to the positively polarized and negatively polarized sides of one piezoelectric plate, and the other positive lead and the other negative lead respectively to the negatively polarized and positively polarized sides of the other piezoelectric plate).

When mounting the piezoelectric package to or within host structure, it is desirable that the stresses exerted by the upper and lower piezoelectric plates combine in a manner that maximizes the strain applied to the host structure when the package is operated as an actuator, or combine in a manner that maximizes the magnitude of combination of the signals received from the upper and lower piezoelectric plates when the package is operated as a sensor. This result can be achieved by judiciously selecting the morphological configuration of the piezoelectric package.

In particular, the relationship between the piezoelectric package and the host structure to which it is installed will often depend on the location of the package relative to the neutral axis of the structure to which the package is mounted. That is, any structure undergoing bending has a neutral axis plane—a plane on which no bending stress is experienced. The location of the neutral axis depends on the boundary conditions, material, and geometry of the structure, among other factors. On one side of this plane, the structure expands and on the other side, it contracts. If the piezoelectric package is located entirely on one side of the neutral axis, a unimorph configuration is better, as both piezoelectric plates will simultaneously expand or simultaneously contract in accordance with the side of the neutral axis on which it resides and the bending direction of the neutral axis. If the neutral axis extends through the piezoelectric package, however, a bimorph configuration is likely better (though it actually depends on the exact location within the piezoelectric package), as one piezoelectric plate will expand while the other piezoelectric plate will contract in accordance the bending direction of the neutral axis.

It can be appreciated that dynamic selection of a unimorph or bimorph configuration allows the user to select the most sensitive configuration in the case where the piezoelectric package is used as a sensor, or the most vibratory configuration in the case where the piezoelectric package is used as an actuator. To enable the dynamic selection of the morphological configuration, the leads, which are respectively disposed along vertical planes to connect to the top and bottom sides of both piezoelectric plates, can be laterally extended out from the piezoelectric package to form two sets of terminals (which may, e.g., be configured in a stair step fashion). Two connectors can then be respectively coupled to the terminal sets, so that a cable can be connected to the appropriate connector to dynamically place the piezoelectric package in the desired morphological configuration.

Because the relative orientation of the leads are vertically fixed, however, it is difficult to orient the respective terminal sets differently in order to enable selectivity between the unimorph and bimorph configurations using identical connectors. While it is theoretically possible to reconfigure the output/input signals at the interface of the control/sensing circuit, in practice, this would require that the device in which the control/sensing circuit is contained be modified to simultaneously input and/or output two signals, and would further require such device to be modified to allow dynamic selection between a unimorph configuration and a bimorph configuration. However, most existing devices designed to operate with piezoelectric packages are only capable of inputting or outputting a single signal. Thus, in this case, different connector configurations must be used in order to enable dynamic selectivity between unimorph and bimorph configuration. As a result, two different cables must be used with the piezoelectric package—one that uniquely couples to the unimorph connector and one that uniquely couples to the bimorph connector. Thus, the proper cable corresponding to the desired morphological configuration must be selected, which may become quite tedious, especially when multiple piezoelectric packages are to be mounted to the host structure.

Thus, there remains a need to provide a scalable and easily manufacturable piezoelectric package whose morphological configuration can be dynamically changed in a more convenient manner.

SUMMARY OF THE INVENTION

In accordance with a first aspect of the present inventions, a piezoelectric package is provided. The piezoelectric package comprises an upper piezoelectric plate having opposing top and bottom electrodes, and a lower piezoelectric plate having opposing top and bottom electrodes. The piezoelectric package further comprises an electrically insulative structure encapsulating the piezoelectric plates. As one example, the insulative structure may form a rigid board.

The piezoelectric package further comprises first and second external connectors mounted to the insulative structure. Significantly, the first and second connectors respectively have first and second connector terminals that are electrically coupled to the electrodes in different orders, and have geometric arrangements that are identical, such that a single interface device (e.g., a cable or a wireless transmitter/receiver) can be selectively mated to either of the connectors.

For example, the first connector terminals may comprise four connector terminals, a first of which is electrically coupled to the bottom electrode of the lower piezoelectric plate, a second of which is electrically coupled to the top electrode of the lower piezoelectric plate, a third of which is electrically coupled to the bottom electrode of the upper piezoelectric plate, and a fourth of which is electrically coupled to the top electrode of the upper piezoelectric plate. In contrast, the second connector terminals may comprise four connector terminals, a first of which is electrically coupled to the bottom electrode of the lower piezoelectric plate, a second of which is electrically coupled to the top electrode of the lower piezoelectric plate, a third of which is electrically coupled to the top electrode of the upper piezoelectric plate, and a fourth of which is electrically coupled to the bottom electrode of the upper piezoelectric plate.

In one embodiment, the piezoelectric package further comprises electrical conductors encapsulated within the insulative structure, and respectively coupled between the electrodes and the connector terminals. The piezoelectric package may further comprise first and second external terminals disposed on the insulative structure. The first external terminals are electrically coupled respectively between the electrical conductors and the first connector terminals, and the second external terminals are electrically coupled respectively between the electrical conductors and the second connector terminals.

If the electrodes extend within respective parallel planes, each of the electrical conductors may comprise an electrically conductive trace and an electrically conductive via (e.g., a blind via), with the electrically conductive trace extending within insulative structure in a direction parallel to the planes, and the via extending within the insulative structure in a direction perpendicular to the planes. In this case, the first and second external terminals may be electrically coupled respectively to the vias in different orders, and the geometric arrangements of the first and second external terminals may be identical, so that identical external connectors can be mounted to the insulative structure.

The piezoelectric package may be incorporated into a system that includes electronic circuitry electrically coupled to the piezoelectric package, and configured for sensing and/or actuating vibrations via the piezoelectric package, and an interface device (e.g., a cable or a wireless transmitter/receiver) configured for mating between the electronic circuitry and either of the first and second connectors. In this case, the piezoelectric package may have a unimorph configuration when the interface device is mated between the electronic circuitry and the first connector, and a bimorph configuration when the interface device is mated between the electronic circuitry and the second connector.

In accordance with a second aspect of the present invention, a system is provided. The system comprises a piezoelectric package (e.g., a printed circuit board) including upper and lower piezoelectric plates and first and second external connectors, with each of the external connectors being electrically coupled to the piezoelectric plates. The system further comprises electronic circuitry configured for sensing and/or actuating vibrations via the piezoelectric package. The system may further comprise a host structure to which the piezoelectric package is mounted. In this case, the electronic circuitry is electrically coupled to the piezoelectric package, and is configured for sensing and/or actuating vibrations within the host structure via the piezoelectric package.

The system further comprises a single interface device (e.g., a cable or a wireless transmitter/receiver) electrically coupled between the electronic circuitry and the piezoelectric package. The single interface device is configured for being selectively mated to either of the external connectors, such that the piezoelectric package is in a unimorph configuration when the interface device is mated to the first external connector, and the piezoelectric package is in the bimorph configuration when the interface device is mated to the second external connector.

In accordance with a third aspect of the present inventions, a method of making a piezoelectric package is provided. The method comprises locating upper and lower piezoelectric plates (each having opposing top and bottom electrodes) adjacent each other. The method further comprises forming electrically conductive traces respectively on at least some of a plurality of electrically insulative sheets, electrically coupling the traces respectively to the electrodes, and bonding the insulative sheets to each other (e.g., by applying heat to the insulative sheets to transform the piezoelectric package into an integrated composite structure). The method may optionally comprise disposing at least one of the insulative sheets between the piezoelectric plates, thereby electrically isolating the bottom electrode of the upper piezoelectric plate from the top electrode of the lower piezoelectric plate. The method may also optionally comprise aligning windows within the insulative sheets, and disposing the piezoelectric elements within the windows.

The method further comprises disposing electrically conductive vias within the insulative sheets and electrically coupled to the traces. The method further comprises electrically coupling first connector terminals of a first external connector respectively to the vias in a first order, and electrically coupling second connector terminals of a second external connector respectively to the vias in a second order different from the first order. The geometric arrangements of the first and second connector terminals are identical, such that a single interface device (e.g., a cable or a wireless transmitter/receiver) can be selectively mated to either of the connectors.

One method further comprises forming first external terminals and second external terminals on one of the insulative sheets, and forming first and second electrically conductive traces on the one insulative sheet, such that they are electrically coupled respectively between the vias and the first and second external terminals. This method further comprises bonding the one electrically insulative sheet to another one of the insulative sheets, and electrically coupling the first connector terminals and second connector terminals respectively to the first external terminals and the second external terminals.

Other and further aspects and features of the invention will be evident from reading the following detailed description of the preferred embodiments, which are intended to illustrate, not limit, the invention.

BRIEF DESCRIPTION OF THE DRAWINGS

The drawings illustrate the design and utility of preferred embodiments of the present invention, in which similar elements are referred to by common reference numerals. In order to better appreciate how the above-recited and other advantages and objects of the present inventions are obtained, a more particular description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF THE EMBODIMENTS

Figure 1:
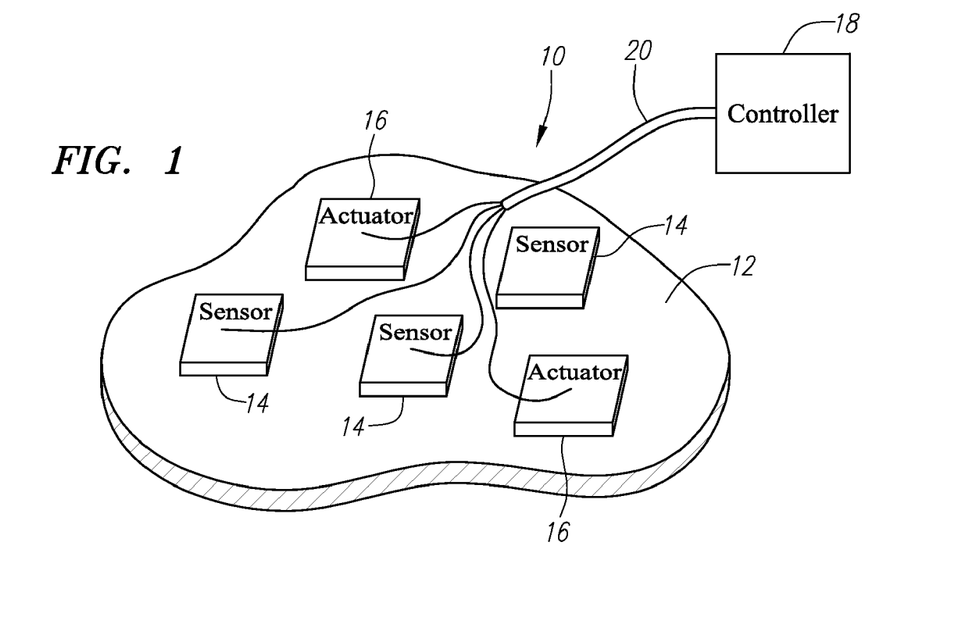
FIG. 1 is a plan view of a vibration analysis and suppression system constructed in accordance with one preferred embodiment of the present inventions.

Referring to FIG. 1, a vibration analysis and suppression system 10 constructed in accordance with one embodiment of the present inventions is described. The system 10 is designed to sense and suppress vibrations within the host structure 12 of equipment whose performance is highly sensitive to vibration. To this end, the system 10 generally comprises a plurality of vibration sensing devices 14, a plurality of vibration actuating devices 16, and a controller 18 coupled to the vibration sensing devices 14 and vibration actuating devices 16 via cables 20. Alternatively, the controller 18 can be coupled to the vibration sensing devices 14 and vibration actuation devices 16 via other interface devices, such as wireless transmitter/receivers. The vibration sensing devices 14 sense environmental vibrations within the host structure 12 and feed vibration response information back to the controller 18, which generates and transmits vibration control signals to the vibration actuating devices 16, which then respond by inducing vibrations within the host structure 12 to suppress the environmental vibrations. The vibration sensing devices 14 and vibration actuating devices 16 are both shown as being mounted to the exterior surface of the host structure 12, e.g., using a quick setting adhesive, such as epoxy, although in alternative embodiments, these devices can be embedded within the host structure 12.

While separate and dedicated vibration sensing devices 14 and vibration actuating devices 16 are shown, the functionality of these devices can be combined into a single vibration sensing/actuating device. In the illustrated embodiment, the controller 18 is remote from the host structure 12, although in alternative embodiments, the controller 18 can be located on the host structure 12 or anywhere else on the equipment. In other embodiments, the circuitry of the controller 18 is col-located with one of, or distributed amongst, the vibration sensing devices 14 and vibration actuating devices 16, similar to the manner disclosed in U.S. patent application Ser. No. 11/262,083, which is expressly incorporated herein by reference. It should be appreciated that the system 10 can alternatively be used to perform non-destructive testing of the host structure 12, in which case, vibration actuating devices 16 may not be utilized.

Figure 2:
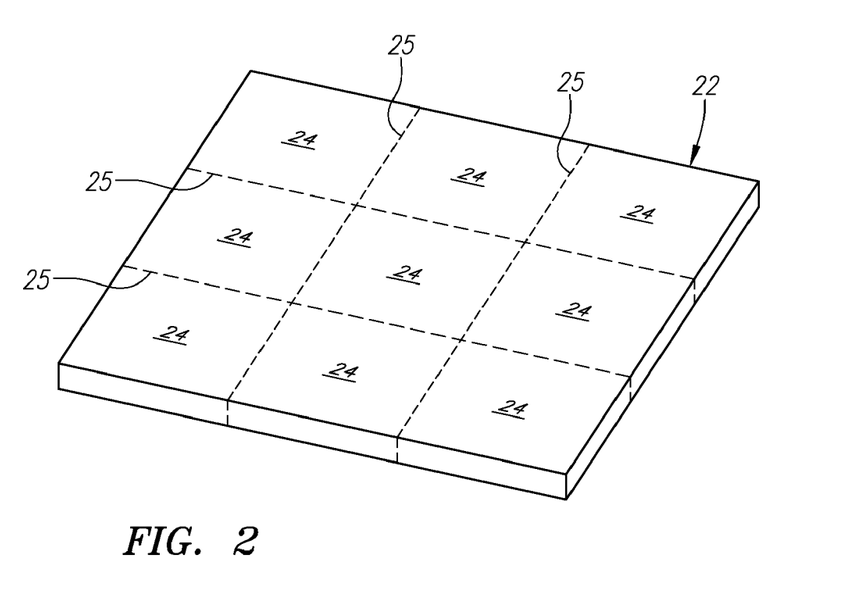
FIG. 2 is a perspective view of one embodiment of a piezoelectric package that can be used as a vibration sensing device or vibration actuating device within the system of FIG. 1.

Referring to FIG. 2, each of the vibration sensing devices 14 and vibration actuating devices 16 takes the form of a piezoelectric package 22, the use of which will characterize the device as either a vibration sensing device 14 and/or a vibration actuating device 16. That is, the piezoelectric package 22 can be characterized as a vibration sensing device 14 if vibration sensing signals are transmitted from the piezoelectric package 22 to the controller 18, and can be characterized as a vibration actuating device 16 if vibration control signals are transmitted from the controller 18 to the piezoelectric package 22. In the illustrated embodiment, the piezoelectric package 22 takes the form of a stiff, low-profile card that can be bonded to the exterior surface of, or embedded within, the host structure 10 without substantially changing the structural or physical response characteristics of the host structure 10. For the purposes of this specification, an element is stiff if it exhibits a Young's modulus greater than $1 \times 10^5$.

Significantly, the piezoelectric package 22 is scalable in that its size can be conveniently decreased without adversely affecting the function of the piezoelectric package 22. In particular, the piezoelectric package 22 is topologically divided into a plurality of piezoelectric cells 24, any of which can be selectively removed from the remaining portion of the package 22. In the illustrated embodiment, the piezoelectric package 22 includes nine piezoelectric cells 24. It should be appreciated, however, that the number of piezoelectric cells 24 in any particular package 22 can be any plurality number, including two piezoelectric cells 24. In the illustrated embodiment, weakened borders 25 are provided between the piezoelectric cell 24 to facilitate separation of the piezoelectric cells 24 from each other. Such weakened borders 25 can be formed, e.g., via perforations made between the piezoelectric cells 24, such that the selected piezoelectric cells 24 can simply be broken off from the remainder of the piezoelectric package 22. Alternatively, the piezoelectric cells 24 can be separated from each other by cutting (e.g., using a saw) selected piezoelectric cells 24 from the remainder of the piezoelectric package 22.

Figure 3:
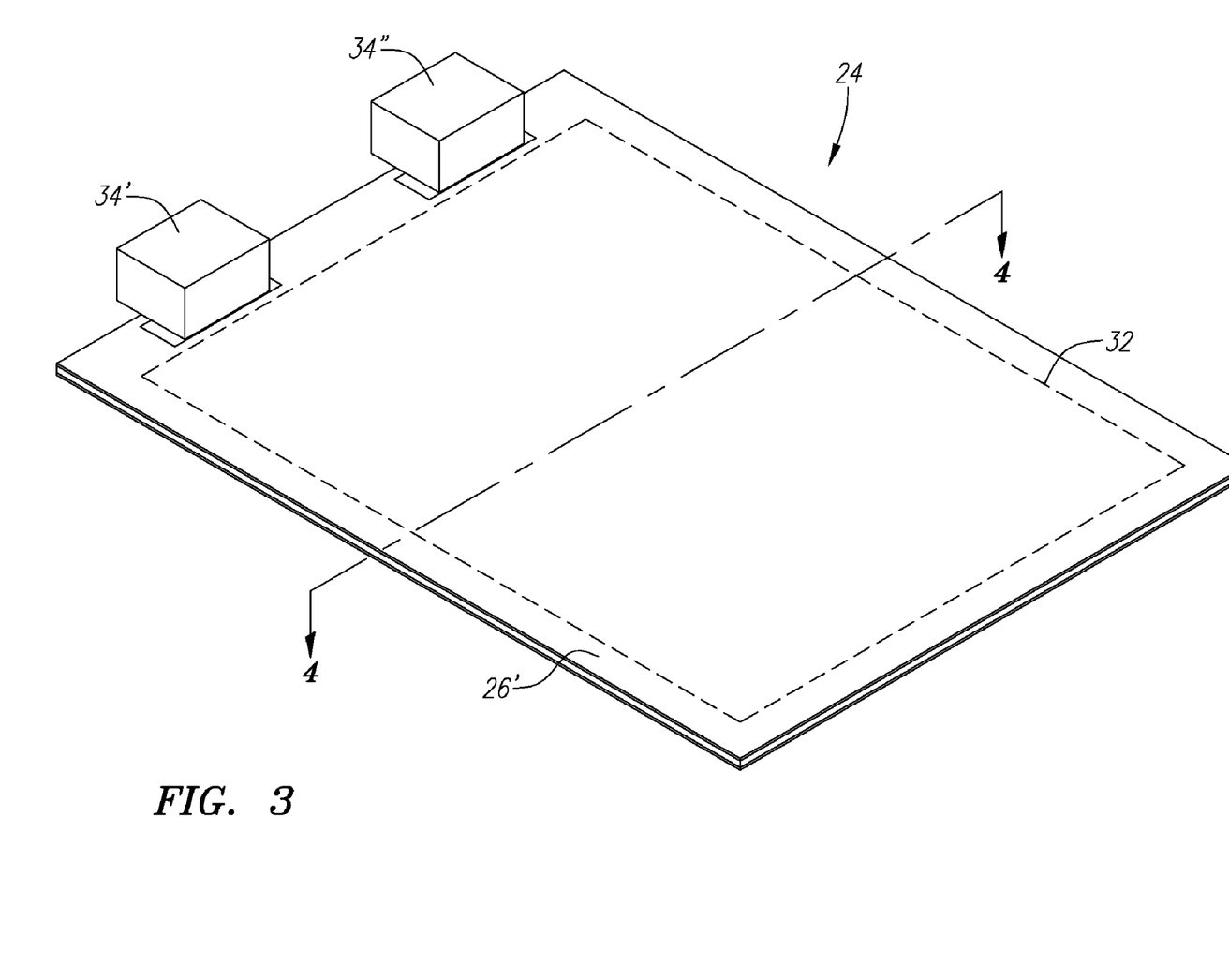
FIG. 3 is a perspective view of one of the piezoelectric cells of the piezoelectric package of FIG. 2.
Figure 4:
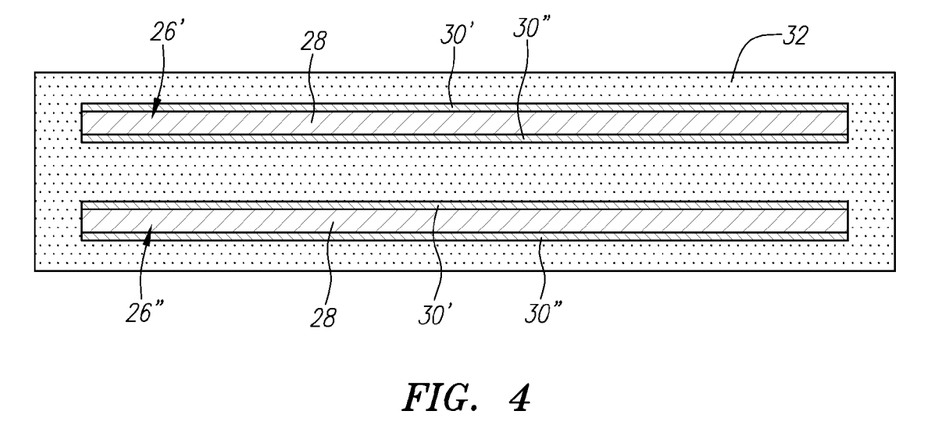
FIG. 4 a cross-sectional view of the piezoelectric cell, taken along the line 4-4.

Referring further to FIGS. 3 and 4, one embodiment of the piezoelectric cell 24 (which is representative of each of the cells 24 illustrated in FIG. 2) will now be described. The piezoelectric cell 24 comprises a pair of piezoelectric plates 26, and in particular, an upper piezoelectric plate 26' and a lower piezoelectric plate 26". It should be appreciated, that the terms "upper" and "lower" are relative and will depend on the orientation of the piezoelectric cell 24. For the purposes of this specification, however, the upper piezoelectric plate 26' will be directly above the lower piezoelectric plate 26" when the piezoelectric cell 24 is placed on its planar surface.

As best shown in FIG. 2, the piezoelectric plates 26 (only the upper piezoelectric plate 26' shown in phantom), span the area of the piezoelectric cell 24, with the exception of a border extending around the piezoelectric cell 24. Furthermore, the planar surfaces of the piezoelectric plates 26 have the same area and generally overlie each other. In the illustrated embodiment, only a single pair of piezoelectric plates 26 is provided, although the piezoelectric cell 24 may include more pairs of piezoelectric plates 26 arranged either in one-dimensional or two-dimensional array.

As best shown in FIG. 4, each piezoelectric plate 26 has a core 28 and a pair of opposing electrodes 30 disposed on the opposing surfaces of the core 28. That is, a top electrode 30' is disposed on the top surface of the core 28 and a bottom electrode 30" is disposed on the bottom surface of the core 28. It should be appreciated that the terms "upper", "lower", "top", and "bottom" are relative and will depend on the orientation of the piezoelectric cell 24. For the purposes of this specification, when the either of the planar surfaces of the piezoelectric cell 24 is resting on a surface, the "upper" is above "lower," and "top," is above "bottom." Each of the electrodes 30 is planar in nature, and can be formed on the opposing surfaces of the core 28 using any suitable process, e.g., electroplating or sputtering. The core 28 can be composed of any suitable piezoelectric material, such as, e.g., lead zirconate titanate (PZT), and the electrodes 30 can be composed of any suitable electrically conductive material, such as nickel.

Each piezoelectric plate 26 has a relatively small thickness; for example, between 5-100 mils thick. In the illustrated embodiment, the thickness of the piezoelectric plates 24 is 60 mils. Notably, for purposes of sensing, thicker piezoelectric plates 24 function better. Such a relatively small thickness allows high electrical field strengths to be achieved when a small amount of voltage (e.g., 10-50V) is applied or induced between the electrodes 30 and advantageously reduces the profile of the piezoelectric cell 24, and thus, the piezoelectric package 22.

The piezoelectric cell 24 further comprises a rigid electrically insulative structure 32 that encapsulates the piezoelectric plates 26. In addition to insulating and protecting the piezoelectric plates 26 (which due to their small thicknesses, are fragile and may break due to irregular stresses when handled, assembled, or cured), the electrically insulative structure 32 provides a rigid structure to which various elements (described below) can be integrated into the piezoelectric cell 24. The electrically insulative structure 32 can be composed of any suitable material, such as a composite material, as will be described in further detail below. In the illustrated embodiment, the insulative structure 32 forms the piezoelectric cell 24, and thus, the piezoelectric package 22, into the shape of a board, which when all of the components are incorporated, takes the form of a printed circuit board, as will be described in further detail below.

Figure 6:
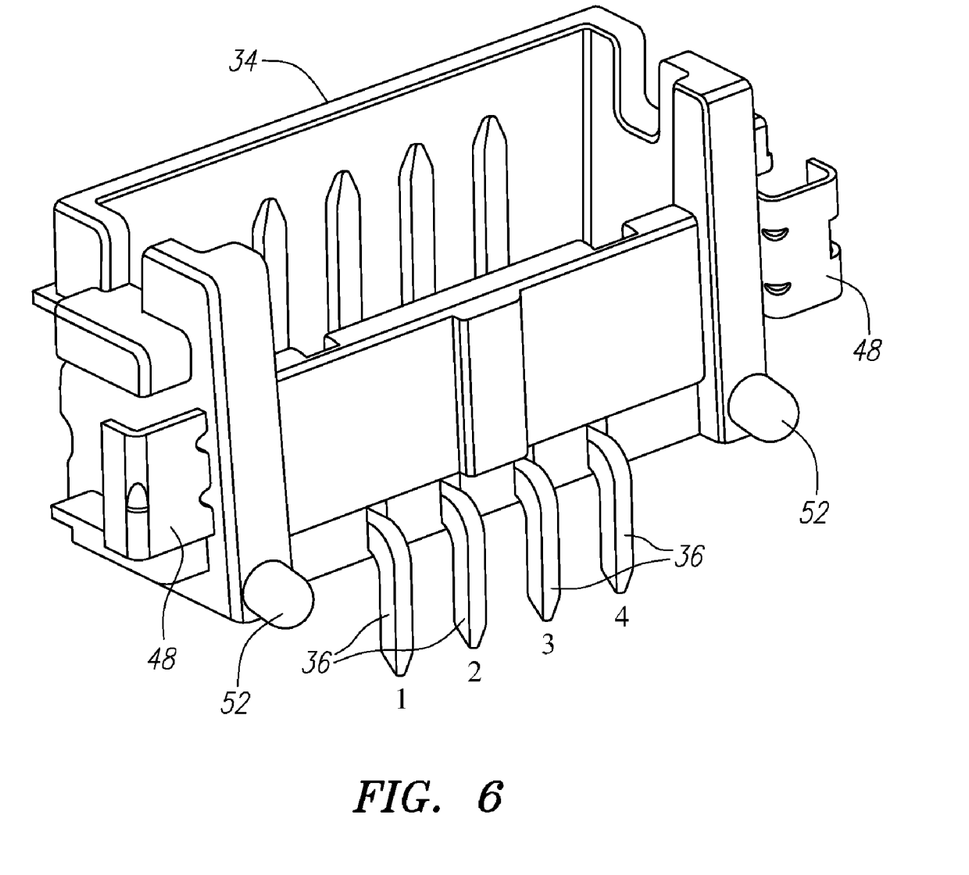
FIG. 6 is a perspective view of an external connector used in the piezoelectric cell of FIG. 3.

As best shown in FIG. 2, the piezoelectric cell 24 further comprises a pair of external connectors 34, and in this case, a unimorph connector 34' and a bimorph connector 34", suitably mounted to the outside of the insulative structure 32. As best shown in FIG. 6, each of the external connectors 34 has a plurality of connector terminals 36, and in this case, four connector terminals 36 (labeled 1-4), which are electrically coupled respectively to the four electrodes 30 of the piezoelectric plates 26, as will be described in further detail below. The connector terminals 36 are also capable of mating with a connector (not shown) at the end of the cable 20 (shown in FIG. 1).

Significantly, with the exception of the connector of the cable 20 that mates with the piezoelectric package 22, the cable is standard (containing two conductors for the signal and ground) and interfaces with the controller 18 in a standard manner (i.e., the connector of the cable 20 that mates with the controller 18 includes two terminals (pins or sockets) that interfaces with two standard terminals (not shown) on the controller 18. Thus, when the cable 20 is mated to either of the connectors 34, the signal conductor within the cable 20 will be connected to two connector terminals 36, and the ground conductor within the cable 20 will be connected to the other two connector terminals 36. In one embodiment, the cable 20 takes the form of a coaxial cable, and the connector that mates with the controller 18 takes the form of a bayonet Neill-Concelman (BNC) connector. As briefly discussed above, instead of a cable 20, a wireless transmitter/receiver (not shown) can be mated to either of the connectors 34.

In the illustrated embodiment, each of the connector terminals 36 takes the form a pin, one end of which is capable of being inserted into a corresponding socket (not shown) in the connector of the cable 20, and the other end of which is capable of being suitably mounted to the terminals on the board, as will be described in further detail below. It should be appreciated that the connector terminals 36 can take the form of any suitable terminals that is capable of mating with a corresponding terminal of the cable 20. For example, each of the connector terminals 36 can, instead, take the form of a socket (not shown) capable of mating with a corresponding pin (not shown) in the connector end of the cable 20. Furthermore, although the connector terminals 36 are illustrated as being surface mount pins, other types of pins, such as through-hole pins can be used.

Significantly, the connector terminals 36 of the external connectors 34 have identical geometric patterns, so that the cable 20 is capable of being selectively mated with either of the connectors 34. However, the connector terminals 36 of the external connectors 34 are electrically coupled to the respective electrodes 30 of the piezoelectric plates 26 in different orders.

For example, with respect to the unimorph connector 36', terminal 1 is coupled to the bottom electrode 30" of the lower piezoelectric plate 26"; terminal 2 is coupled to the top electrode 30' of the lower piezoelectric plate 26"; terminal 3 is coupled to the bottom electrode 30" of the upper piezoelectric plate 26'; and terminal 4 is coupled to the top electrode 30' of the upper piezoelectric plate 26'. With respect to the bimorph connector 36", terminal 1 is coupled to the bottom electrode 30" of the lower piezoelectric plate 26"; terminal 2 is coupled to the top electrode 30' of the lower piezoelectric plate 26"; terminal 3 is coupled to the top electrode 30' of the upper piezoelectric plate 26'; and terminal 4 is coupled to the bottom electrode 30" of the upper piezoelectric plate 26'.

In this manner, without modifying the controller 12 (shown in FIG. 1) or its interface with the cable 20, the piezoelectric cell 24, and thus, the piezoelectric package 22, can be configured as a unimorph when the cable 20 is mated to the unimorph connector 34', and configured as a bimorph when the cable 20 is mated to the bimorph connector 34".

Figure 5:
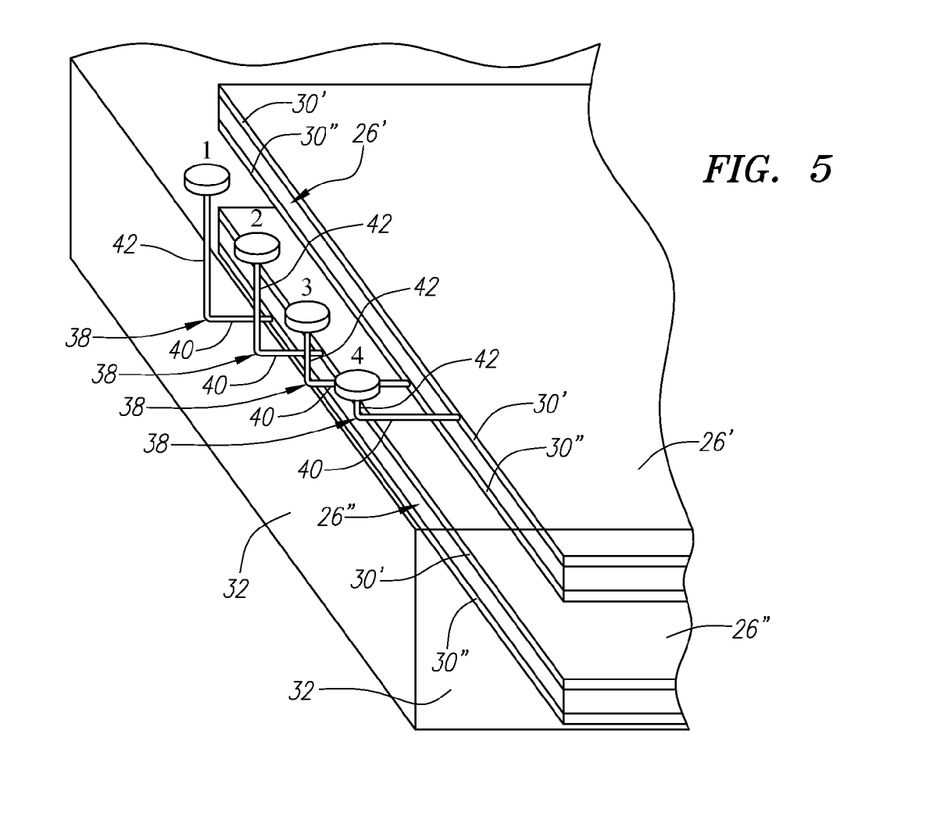
FIG. 5 is a partially cut-away perspective view of the piezoelectric cell of FIG. 3, wherein the insulative structure is transparent to show the internal components of the piezoelectric cell.

Referring further to FIG. 5, one exemplary manner in which the connector terminals 36 of the respective connectors 34 can be electrically coupled to the electrodes 30 of the piezoelectric plates 26 in two different orders will now be described. The piezoelectric cell 24 further comprises a number of internal electrical conductors 38 (in this case, four conductors 38 corresponding to the four electrodes 30 on the piezoelectric plates 26 and the four terminals 36 on each of the connectors 36) encapsulated within the insulative structure 32. The conductors 38 may be composed of any suitable electrically conductive material, such as copper, which as will be described in further detail below, are consistent with forming the conductors 38 via an electroplating or chemical etching process.

In the illustrated embodiment, each conductor 38 includes a low-profile electrically conductive trace 40 and an electrically conductive via 42. Each trace 40 is coupled to a corresponding electrode 30 on one of the piezoelectric plates 26 and extends away from the electrode 30 in a horizontal direction (i.e., parallel to the plane in which the piezoelectric plate 26 extends). Each via 42 is extends in a vertical direction (i.e., perpendicular to the plane in which the piezoelectric plates 26 extends) to the top of the insulative structure 32. In the illustrated embodiment, each via 42 is a blind via; i.e., each via 42 is visible only on the top surface of the board. Significantly, the use of the traces 40 and vias 42 facilitates electrical coupling to the electrodes 30 of the piezoelectric plates 26 in any order.

Figure 7:
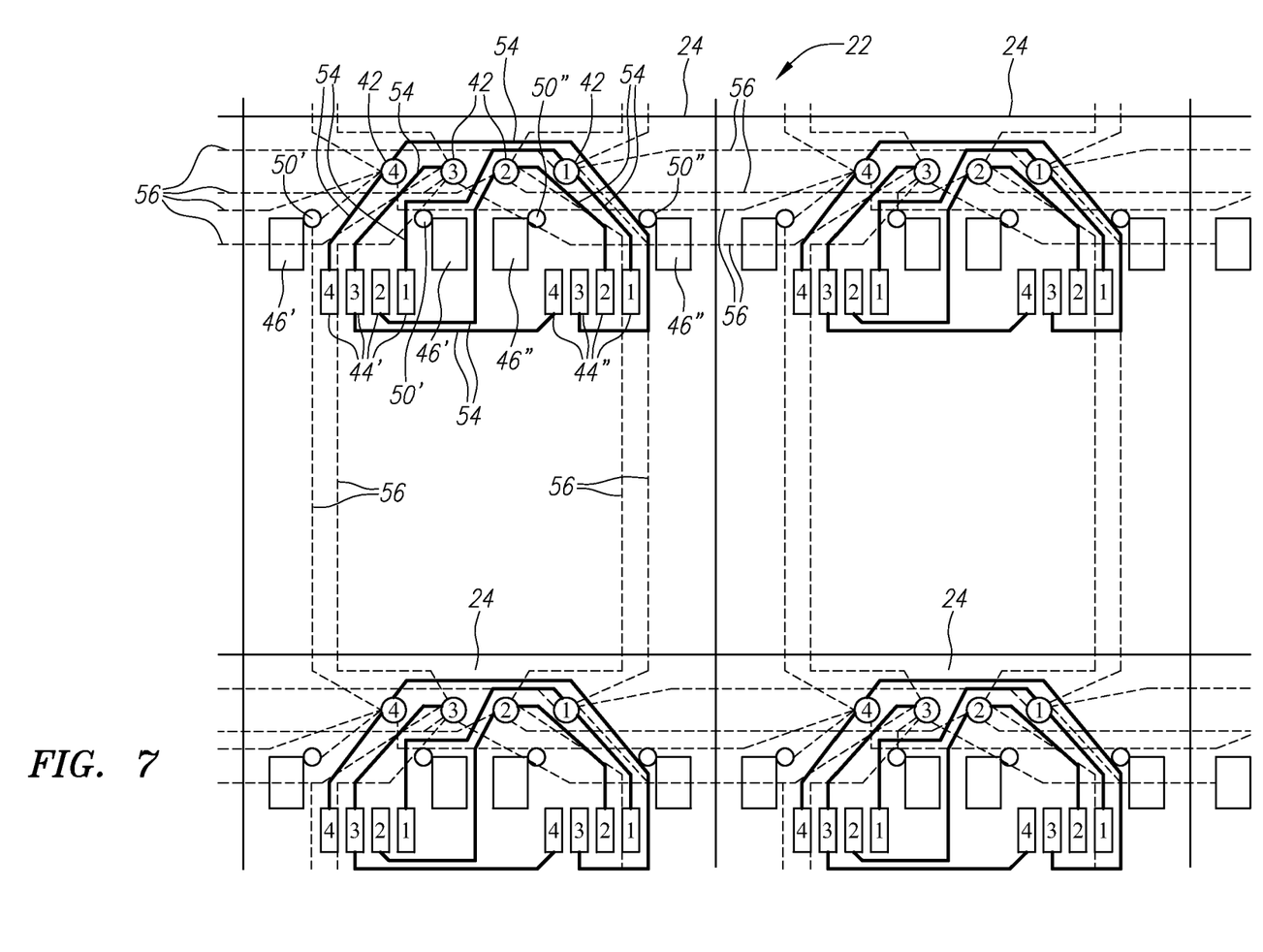
FIG. 7 is a plan view of the conductive pathways used to electrically couple board terminals to vias within a piezoelectric cell and between the piezoelectric cells of the piezoelectric package of FIG. 2.

In particular, as best shown in FIG. 7, the piezoelectric cell 24 further comprises external board terminals 44, and in particular, a first set of external board terminals 44' to which the connector terminals 36 of the unimorph connector 34' can be electrically coupled, and a second set of external board terminals 44" to which the connector terminals 36 of the bimorph connector 34" can be electrically coupled. Notably, for purposes of illustration, the board terminals 44 are shown as being bare (i.e., without the connectors) in FIG. 7. In the illustrated embodiment, the board terminals 44 take the form of solder pads to which the respective connector terminals 36 can be soldered, although in alternative embodiments, the board terminals 44 can be take the form of any terminals to which the connector terminals 36 can be connected. For example, the board terminals 44 can take the form of through-hole terminals (not shown) in the alternative case where the connector terminals 36 take the form of through-hole pins.

Although the soldering of the connector terminals 36 to the respective board terminals 44 affixes the external connectors 34 to a certain extent, the piezoelectric cell 24 further comprises mounting pads 46, and in particular, a first pair of mounting pads 46' to which lateral flanges 48 of the unimorph connector 34' can be affixed, and a second pair of mounting pads 46" to which lateral flanges of the bimorph connector 34" can be affixed (flanges 48 of generic connector 34 shown in FIG. 6). The affixation of the connectors 34 to the respective mounting pads 46 can be accomplished using suitable means, e.g., soldering. The piezoelectric cell 24 can be provided with alignment holes 50, and in particular, a pair of alignment holes 50' in which corresponding alignment pins 52 on the bottom of the unimorph connector 34' can be inserted, and a pair of alignment holes 50" in which corresponding alignment pins 52 on the bottom of the bimorph connector 34" can be inserted (pins 52 of generic connector 34 shown in FIG. 6), thereby facilitating alignment of the connector terminals 36 with the board terminals 44 during the mounting process. Significantly, the first and second sets of board terminals 44 have identical geometric patterns, so that identical connectors 36 can be coupled to the board.

Each set of board terminals 44 is electrically coupled to the vias 42 (and thus, the electrodes 30 of the piezoelectric plates 26) via conductors 54 (in this case, electrically conductive traces shown in dark solid lines). In the illustrated embodiment, the conductors 54 are disposed on the top surface of the board, but in alternative embodiments, any of the conductors 54 can be internally routed within the board to the corresponding vias 42. In some cases, a terminal on one set can be electrically coupled to a corresponding via 42 through a terminal on the other set. Significantly, the first set of board terminals 44' (and thus, the connector terminals 36 of the unimorph connector 34') are electrically coupled to the vias 42 (and thus, the electrodes 30 of the piezoelectric plates 26) in a different order than the second set of board terminals 44" (and thus, the connector terminals 36 of the bimorph connector 34") are electrically coupled to the vias 42 (and thus, the electrodes 30 of the piezoelectric plates 26).

To facilitate an understanding of these different connector orders, the vias 42 have been labeled 1-4 from right to left, the first set of board terminals 44' have been labeled 1-4 from right to left, and the second set of board terminals 44" have been labeled 1-4 from right to left.

With respect to the first set of board terminals 44' (and thus, the unimorph connector 34'), board terminal 1 (and thus, connector terminal 1) is coupled to via 1 (and thus, the bottom electrode 30" of the lower piezoelectric plate 26"); board terminal 2 (and thus, connector terminal 2) is coupled to via 2 (and thus, the top electrode 30' of the lower piezoelectric plate 26"); board terminal 3 (and thus, connector terminal 3) is coupled to via 3 (and thus, the bottom electrode 30" of the upper piezoelectric plate 26'); and board terminal 4 (and thus, connector terminal 4) is coupled to via 4 (and thus, the top electrode 30' of the upper piezoelectric plate 26'). Thus, the terminal pattern for a unimorph configuration is 1-2-3-4.

In contrast, with respect to the second set of board terminals 44" (and thus, the bimorph connector 34"), terminals 3 and 4 have been switched. In particular, board terminal 1 (and thus, connector terminal 1) is coupled to via 1 (and thus, the bottom electrode 30" of the lower piezoelectric plate 26"); board terminal 2 (and thus, connector terminal 2) is coupled to via 2 (and thus, the top electrode 30' of the lower piezoelectric plate 26"); board terminal 3 (and thus, connector terminal 3) is coupled to via 4 (and thus, the top electrode 30' of the upper piezoelectric plate 26'); and board terminal 4 (and thus, connector terminal 4) is coupled to via 3 (and thus, the bottom electrode 30" of the upper piezoelectric plate 26'). Thus, the terminal pattern for a bimorph configuration is 1-2-4-3.

It should be appreciated that any terminal pattern that allows the piezoelectric cell 24 to be configured between a unimorph and a bimorph can be used, and will ultimately depend on the specific electrodes 30 that the vias 42 are electrically coupled to and which connector terminals 36 will carry a signal and which connector terminals 36 will be grounded. In the illustrated embodiment, connector pins 2 and 4 carry the signal (and are, thus, both coupled to the signal conductor in the cable 20) and connector terminals 1 and 3 are grounded (and are, thus, both coupled to the ground conductor in the cable 20) for both the unimorph and bimorph configurations.

As briefly discussed above, the piezoelectric package 22 is scalable in that selected ones of the piezoelectric cells 24 can be removed to reduce the size of the package 22. Significantly, the upper piezoelectric elements 26' in every piezoelectric cell 24 are electrically coupled together in parallel, and the lower piezoelectric elements 26" in every piezoelectric cell 24 are electrically coupled together in parallel. Thus, each of the external connectors 34 is electrically coupled to the piezoelectric elements 26 in every piezoelectric cell 24, so that the cable 20 need only be connected to one connector to operate all of the piezoelectric cells 24.

To this end, the piezoelectric package 22 comprises a plurality of intercellular conductors 56 (and in this case, electrically conductive traces) that electrically couple immediately adjacent piezoelectric cells 24 together. For purposes of clarity, the conductors 56 that couple piezoelectric cells 24 on the left and on the right are shown in dotted lines, and the conductors 56 that couple piezoelectric cells 24 at the top and at the bottom are shown in dashed lines. In the illustrated embodiment, the intercellular conductors 56 are electrically coupled between the corresponding vias 42 of the adjacent piezoelectric cells 24 in a daisy-chain fashion.

That is, for any two piezoelectric cells 24 that are coupled together, via 1 is connected to via 1, via 2 is connected to via 2, via 3 is connected to via 3, and via 4 is connected to via 4. Thus, each connector 34 will be electrically coupled to other piezoelectric cells 24 in the same manner that it is electrically coupled to its own piezoelectric cell 24. Notably, when any of the piezoelectric cells 24 are removed from the piezoelectric package 22, the functioning of the remaining piezoelectric cells 24 will not be affected. In particular, the external connectors 34 will remain electrically coupled to the electrodes 30 of the piezoelectric plates 26 in their own piezoelectric cell 24, as well as to the electrodes 30 of the piezoelectric plates 26 in the remaining piezoelectric cells 24, when any of the intercellular conductors 56 is severed.

Figure 8:
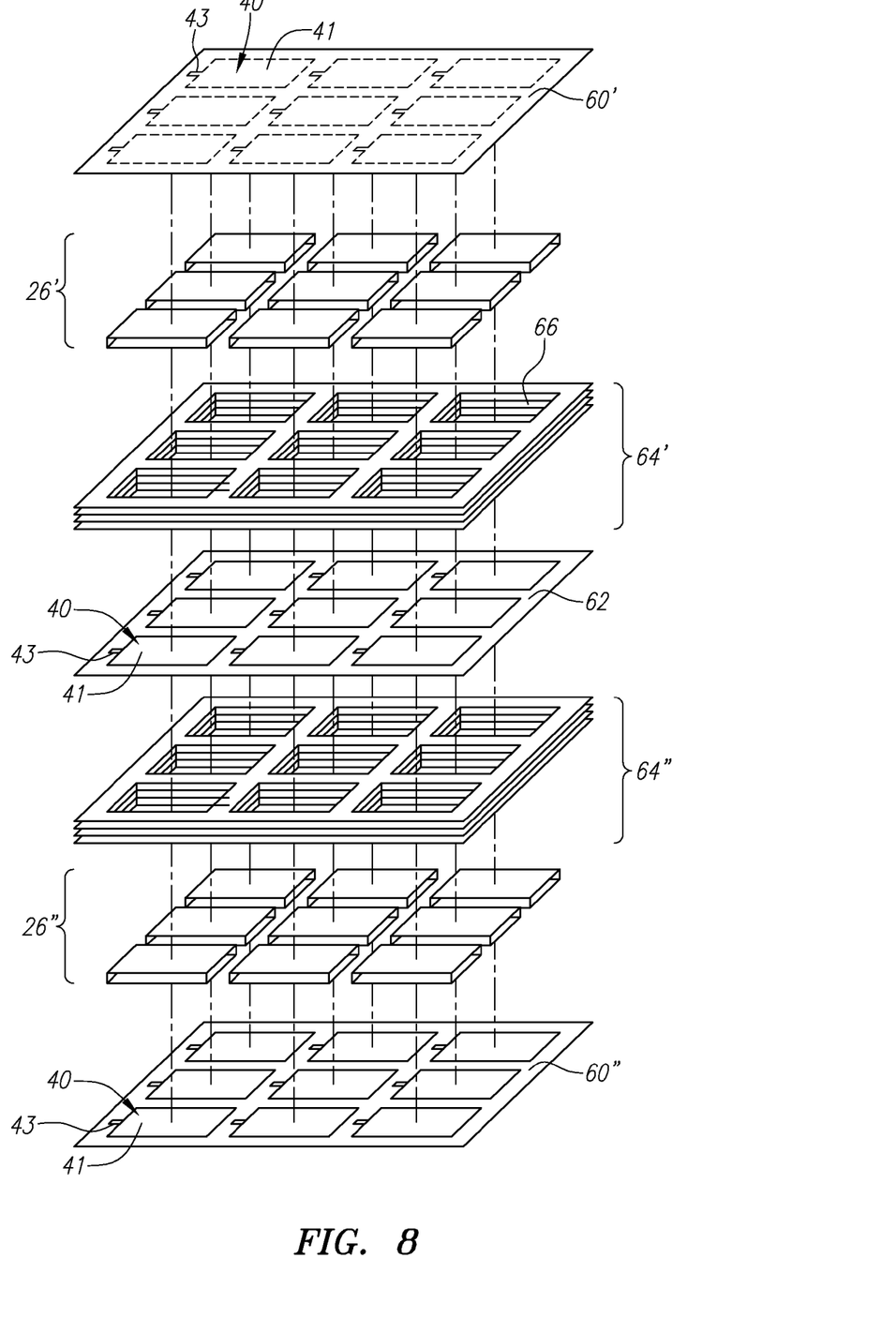
FIG. 8 is an exploded view of a laminate structure that can be cured to form the piezoelectric package of FIG. 2.

Having described its structure, a method of manufacturing the piezoelectric package 22 will be described with respect to FIGS. 8-10. In this method, the piezoelectric package 22 is created from a multilayer laminate comprising a layup of two layers of piezoelectric plates 26 (an upper layer of piezoelectric plates 26' and a lower layer of piezoelectric plates 26", two outer electrically insulative sheets 60 (an upper insulative sheet 60' and a lower insulative sheet 60"), an inner electrically insulative sheet 62, and thickening sheets 64 (an upper set of thickening sheets 64' and a lower set of thickening sheets 64"). Each of the foregoing sheets can be originally provided in a roll that is then cut to size. As will be described in further detail below, this layup is then cured to form a composite structure of the piezoelectric package 22.

Each of the insulative sheets 60, 62 and the thickening sheets 64 is composed of an electrically insulative fiber matrix impregnated with a resin, and in the illustrated method, a fiberglass/epoxy pre-impregnated material (e.g., E-761 Epoxy Pre-Preg with 7781 E-Glass), which has proven to be a good electrically insulating material with high strength. Alternatively, other pre-impregnated material compatible to composite manufacturing techniques can be used. Preferably, such alternative pre-impregnated material has a Young's modulus similar or greater than fiberglass/epoxy pre-impregnated material; for example, Kevlar®/epoxy pre-impregnated material.

Each of the insulative sheets 60, 62 can have any suitable thickness; for example, in the range of 5-20 mils when cured.

In the illustrated embodiment, the insulative sheets 60, 62 each have a 9 mil thickness when cured. The upper set of thickening sheets 64', which will be located on the same plane as the upper piezoelectric plates 26', preferably have a combined thickness that is the same as the thickness of the upper piezoelectric plates 26', and the lower set of thickening sheets 64", which will be located on the same plane as the lower piezoelectric plates 26", preferably have a combined thickness that is the same as the thickness of the lower piezoelectric plates 26".

Each of the thickening sheets 64 includes a plurality of windows 66 for respectively receiving the piezoelectric plates 26 therein. In this case, nine windows 66 are provided in each thickening sheet 64', which corresponds to the nine upper piezoelectric plates 26', and nine windows 66 fare provided in each thickening sheet 64", which corresponds to the nine lower piezoelectric plates 26". Of course, any number of windows 66 can be provided in the thickening sheets 64 depending on the number of piezoelectric plates 26 that are to be accommodated. Because the upper layer of piezoelectric plates 26' and lower layer of piezoelectric plates 26" will exactly correspond with each other, the pattern of windows 66 in the upper thickening sheets 64' and lower thickening sheets 64" will be identical.

The method of manufacturing the piezoelectric package 22 is first initiated by forming the electrically conductive traces 40 onto the insulative sheets 60', 60", and 62. In particular, a first set of electrical traces 40 (shown in phantom) is formed on the lower surface of the upper insulative sheet 60', a second set of electrical traces 40 is formed on the upper surface of the inner insulative sheet 62, a third set of electrical traces 40 (not shown) are formed on the lower surface of the inner insulative sheet 62, and a fourth set of electrical traces 40 is formed on the upper surface of the lower insulative sheet 60". As there shown, each electrical trace 40 includes a large surface region 41 that will coincide with one of the electrodes of a corresponding piezoelectric plate 26, and a relatively small thin region 43 that will be connected to the corresponding via. The board terminals 44, mounting pads 46, and electrically conductive traces 54 can be disposed onto the top surface of the upper insulative sheet 60' in the desired patterns. The intercellular traces 56 can also be disposed on selected ones of the thickening sheets 64 in the desired patterns. The traces 40, board terminals 44, mounting pads 46, traces 54, and traces 56 can be disposed on the respective insulative sheets using any suitable method, such as chemical etching or electroplating. The vias 42 can be formed through the upper insulative sheet 60', insulative sheet 62, and thickening sheets 64 using suitable means, such as electroplating or insertion of small rivets.

Figure 9:
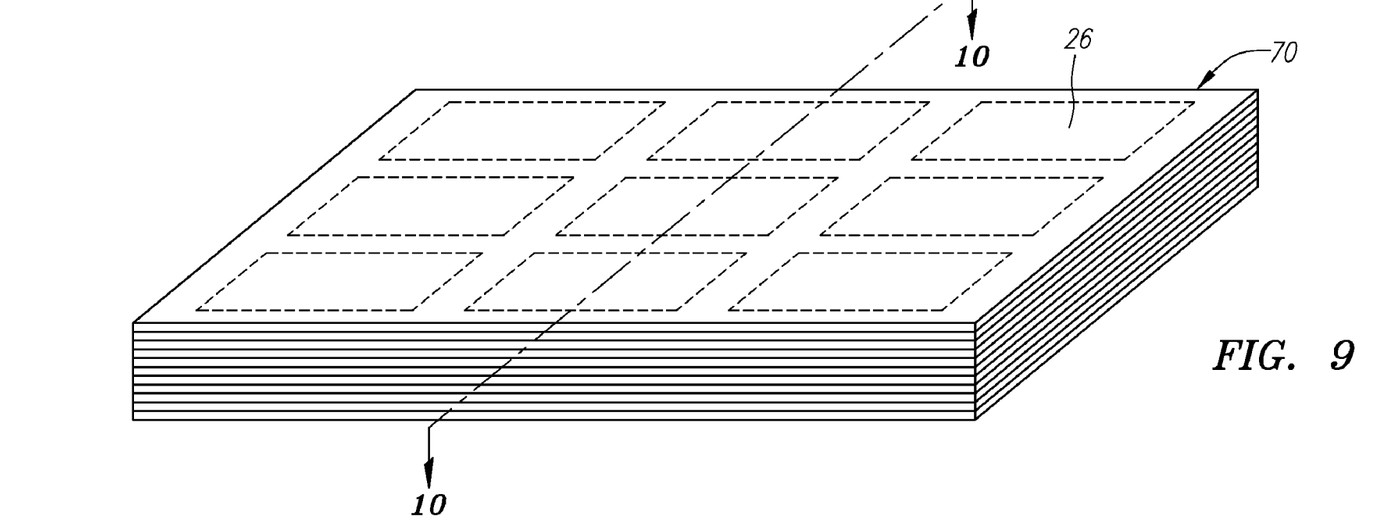
FIG. 9 is a perspective view of the laid-up laminate structure of FIG. 8.
Figure 10:
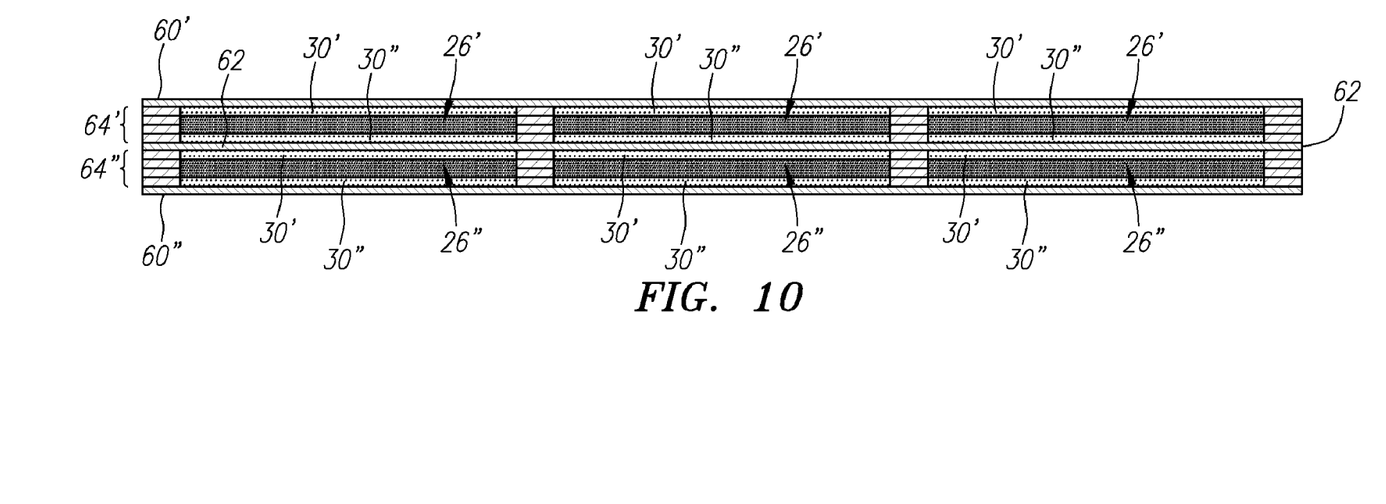
FIG. 10 is a cross-sectional view of the laid-up laminate structure of FIG. 9, taken along the line 10-10.

Next, the insulative sheets 60, 62, thickening sheets 64, and piezoelectric plates 26 are laid onto of each other from bottom to top to form a laminate structure 70 (as shown in FIGS. 9 and 10). When the laminate structure 70 is laid up, the inner insulative sheet 62 is disposed between the respective upper and lower layers of piezoelectric plates 26 to electrically isolate them from each other, while allowing the upper and lower piezoelectric plates 26 to be located closely adjacent to each other, and the windows 66 in the thickening sheets 64 are aligned, so that the piezoelectric plates 26 can be inserted into the respective windows 66.

This can be accomplished by aligning the windows 66 of the lower thickening sheets 64" over the lower insulative sheet 60", inserting the lower piezoelectric plates 26" within the respective aligned windows 66, disposing the inner insulative sheet 62 over the lower thickening sheets 64" and piezoelectric plates 26", aligning the windows 66 of the upper thickening sheets 64 over the inner insulative sheet 62, inserting the upper piezoelectric plates 26' within the respective aligned windows 66, and disposing the upper insulative sheet 60" over the upper thickening sheets 64' and piezoelectric plates 26'.

When the piezoelectric plates 26 are inserted within the corresponding windows 66 of the thickening sheets 64, the large regions 41 of the electrical traces 40 disposed on the lower surface of the upper insulative sheet 60' will be in direct electrical contact with the top electrodes 30' of the respective upper piezoelectric plates 26', the large regions 41 of the electrical traces 40 disposed on the upper surface of the inner insulative sheet 62 will be in direct electrical contact with the lower electrodes 30" of the respective upper piezoelectric plates 26', the large regions 41 of the electrical traces 40 disposed on the lower surface of the inner insulative sheet 62 will be in direct electrical contact with the top electrodes 30' of the respective lower piezoelectric plates 26", and the large regions 41 of the electrical traces 40 disposed on the upper surface of the lower insulative sheet 60" will be in direct electrical contact with the bottom electrodes 30" of the respective lower piezoelectric plates 26".

After the laminate structure 70 has been laid up, it can be inserted into an oven and cured. During the curing process, the resin from the insulative sheets 60, 62, and 64 flows to coat the fibers within these sheets and fill in any gaps within the structure that would otherwise form air pockets within the piezoelectric package 22. The resin then polymerizes into a rigid composite structure. As a result of this process, the insulative sheets 60, 62, and 64 form the insulative structure 32 (shown in FIGS. 3-5).

Preferably, a vacuum seal is provided around the laminate structure (e.g., by using a vacuum bag) during the curing process to enable extraction of unused resin and to produce a thin, low profile piezoelectric package 22. That is, the vacuum seal makes use of external atmospheric pressure to compress the laminate structure and to extract any unwanted air and excess resin. The laminate structure is preferably cured at the temperature and for a duration that is recommended by the manufacturer of the insulative sheets 60, 62, 64. However, care must be taken not to cure the laminate structure at a temperature that is greater than the Curie temperature of the piezoelectric plates 26 above which the piezoelectric properties are lost of the piezoelectric plates 26 (i.e., the dipoles in the piezoelectric plates 26 become randomly oriented, such that the net motion in response to an electrical field becomes zero). To this end, the insulative sheets 60, 62, 64 are selected, such that their recommended curing temperature does not exceed the Curie temperature of the piezoelectric plates 26; for example, at a temperature of 350° F. Notably, the temperature at which the resin polymerizes will depend on the exact composition of the resin. In some embodiments, the resin may polymerize at relatively low temperatures; for example, at room temperature, in which case, the laminate structure need only be heated to room temperature. If the piezoelectric properties of the piezoelectric plates 26 happen to be lost due to excessive temperature, the piezoelectric plates 26 can be repolarized.

After laminate structure of the piezoelectric package 22 has been fabricated and cured, the external connectors 34 can be mounted to the board terminals 44 using a suitable means, such as welding or soldering. The weakened borders 25 (shown in FIG. 2) may be formed into the piezoelectric package 22, e.g., by perforating the insulative structure 32 between the piezoelectric cells 24. After the piezoelectric package 22 has been completely fabricated, it can optionally be located within an environmental case (not shown), such as the case described in U.S. patent application Ser. No. 12/038,782, entitled "Piezoelectric Package With Enlarged Conductive Layers," which is expressly incorporated herein by reference.

At various times between the lay-up of the laminate structure 70 and the mounting of the external connectors 34 to the board, the assembly can be electrically tested to ensure that the board terminals 44 are electrically independent from each other (via conductance measurements) and that the piezoelectric plates 26 are properly working and oriented (via capacitance measurements). If conductivity exists between the board terminals 44, sheets of the laminate structure 70, if not already cured, must be realigned. Small wires (not shown) can be temporarily soldered to the board terminals 44 to facilitate the conductivity and capacitance tests. Notably, as a piezoelectric plate become more restricted, its capacitance should decrease. For example, the capacitance of a piezoelectric plate by itself should be the highest, with the capacitance gradually dropping as the piezoelectric plate is placed in the lay-up, then in the cured composite, and finally within an environmental case.

Although particular embodiments of the present invention have been shown and described, it should be understood that the above discussion is not intended to limit the present invention to these embodiments. It will be obvious to those skilled in the art that various changes and modifications may be made without departing from the spirit and scope of the present invention. Thus, the present invention is intended to cover alternatives, modifications, and equivalents that may fall within the spirit and scope of the present invention as defined by the claims.

What is claimed is:

1. A piezoelectric package, comprising:
   an upper piezoelectric plate having opposing top and bottom electrodes;
   a lower piezoelectric plate having opposing top and bottom electrodes;
   an electrically insulative structure encapsulating the piezoelectric plates;
   a first external connector mounted to the insulative structure, the first connector having first connector terminals electrically coupled to the electrodes in a first order; and
   a second external connector mounted to the insulative structure, the second connector having second connector terminals electrically coupled to the electrodes in a second order different from the first order, wherein the geometric arrangement of the first connector terminals are identical to the geometric arrangement of the second connector terminals, such that a single interface device can be selectively mated to either of the connectors.

2. The piezoelectric package of claim 1, wherein the insulative structure forms a board.

3. The piezoelectric package of claim 1, wherein the insulative structure is composed of a rigid material.

4. The piezoelectric package of claim 1, wherein:
   the first connector terminals comprise four connector terminals, a first of which is electrically coupled to the bottom electrode of the lower piezoelectric plate, a second of which is electrically coupled to the top electrode of the lower piezoelectric plate, a third of which is electrically coupled to the bottom electrode of the upper piezoelectric plate, and a fourth of which is electrically coupled to the top electrode of the upper piezoelectric plate; and
   the second connector terminals comprise four connector terminals, a first of which is electrically coupled to the bottom electrode of the lower piezoelectric plate, a second of which is electrically coupled to the top electrode of the lower piezoelectric plate, a third of which is electrically coupled to the top electrode of the upper piezoelectric plate, and a fourth of which is electrically coupled to the bottom electrode of the upper piezoelectric plate.

5. The piezoelectric package of claim 1, further comprising electrical conductors encapsulated within the insulative structure, wherein the electrical conductors are respectively coupled between the electrodes and the connector terminals.

6. The piezoelectric package of claim 5, further comprising first external terminals and second external terminals disposed on the insulative structure, wherein the first external terminals are electrically coupled respectively between the electrical conductors and the first connector terminals, and the second external terminals are electrically coupled respectively between the electrical conductors and the second connector terminals.

7. The piezoelectric package of claim 6, wherein the electrodes extend within respective parallel planes, wherein each of the electrical conductors comprises an electrically conductive trace and an electrically conductive via, the electrically conductive trace extending within insulative structure in a direction parallel to the planes, and the via extending within the insulative structure in a direction perpendicular to the planes.

8. The piezoelectric package of claim 7, wherein the first external terminals are electrically coupled respectively to the vias in a first order, and the second external terminals are electrically coupled to the vias in a second order different from the first order, wherein the geometric arrangement of the first external terminals is identical to the geometric arrangement of the second external terminals.

9. The piezoelectric package of claim 7, wherein each of the vias is a blind via.

10. The piezoelectric package of claim 1, wherein the single interface device is a cable.

11. The piezoelectric package of claim 1, wherein the single interface device is a wireless transmitter/receiver.

12. A system, comprising:
   the piezoelectric package of claim 1;
   electronic circuitry electrically coupled to the piezoelectric package, the electronic circuitry configured for sensing and/or actuating vibrations via the piezoelectric package; and
   an interface device configured for mating between the electronic circuitry and either of the first and second connectors.

13. The system of claim 12, wherein the piezoelectric package has a unimorph configuration when the cable is mated between the electronic circuitry and the first connector, and a bimorph configuration when the cable is mated between the electronic circuitry and the second connector.

14. A system, comprising:
   a piezoelectric package including upper and lower piezoelectric plates and first and second external connectors, each of the external connectors being electrically coupled to the piezoelectric plates;
   electronic circuitry configured for sensing and/or actuating vibrations via the piezoelectric package;
   a single interface device electrically coupled between the electronic circuitry and the piezoelectric package, wherein the single interface device is configured for being selectively mated to either of the first and second external connectors, wherein the piezoelectric package is in a unimorph configuration when the single interface device is mated to the first external connector, and the piezoelectric package is in the bimorph configuration when the single interface device is mated to the second external connector.

15. The system of claim 14, wherein the piezoelectric package takes the form of a printed circuit board.

16. The system of claim 14, further comprising a host structure to which the piezoelectric package is mounted, wherein the electronic circuitry is electrically coupled to the piezoelectric package, the electronic circuitry configured for sensing and/or actuating vibrations within the host structure via the piezoelectric package.

17. The system of claim 14, wherein the single interface device is a cable.

18. The system of claim 14, wherein the single interface device is a wireless transmitter/receiver.

19. A method of making the piezoelectric package of claim 7, comprising:
- locating the upper and lower piezoelectric plates adjacent each other;
- forming the electrically conductive traces respectively on at least some of a plurality of electrically insulative sheets;
- electrically coupling the traces respectively to the electrodes;
- bonding the insulative sheets to each other to form the insulative structure;
- disposing the electrically conductive vias within the insulative sheets, wherein the vias and traces are electrically coupled respectively to each other; and
- electrically coupling the first connector terminals of the first external connector respectively to the vias in the first order; and
- electrically coupling the second connector terminals of the second external connector respectively to the vias in the second order.

20. The method of claim 19, wherein bonding the insulative sheets comprises applying heat to the insulative sheets to transform the piezoelectric package into an integrated composite structure.

21. The method of claim 19, further comprising:
- forming the first external terminals and the second external terminals on one of the insulative sheets;
- forming first electrically conductive traces and second electrically conductive traces on the one insulative sheet, the first traces electrically coupled respectively between the vias and the first external terminals, and the second traces electrically coupled respectively between the vias and the second external terminals;
- bonding the one electrically insulative sheet to another one of the insulative sheets;
- electrically coupling the first connector terminals respectively to the first external terminals; and
- electrically coupling the second connector terminals respectively to the second external terminals.

22. The method of claim 19, further comprising disposing at least one of the insulative sheets between the piezoelectric plates, thereby electrically isolating the bottom electrode of the upper piezoelectric plate from the top electrode of the lower piezoelectric plate.

23. The method of claim 19, wherein the insulative sheets have windows, the method further comprising:
- aligning the windows; and
- disposing the piezoelectric elements within the windows.

24. The method of claim 19, wherein the single interface device is a cable.

25. The method of claim 19, wherein the single interface device is a wireless transmitter/receiver.

* * * * *